United States Patent [19]
Jacobsen

[11] Patent Number: 5,269,882
[45] Date of Patent: Dec. 14, 1993

[54] METHOD AND APPARATUS FOR FABRICATION OF THIN FILM SEMICONDUCTOR DEVICES USING NON-PLANAR, EXPOSURE BEAM LITHOGRAPHY

[75] Inventor: Stephen C. Jacobsen, Salt Lake City, Utah

[73] Assignee: Sarcos Group, Salt Lake City, Utah

[21] Appl. No.: 816,628

[22] Filed: Dec. 31, 1991

Related U.S. Application Data

[63] Continuation-in-part of Ser. No. 647,659, Jan. 28, 1991, Pat. No. 5,106,455.

[51] Int. Cl.⁵ .............. H01L 21/306; B44C 1/22; C03C 15/00; C03C 25/06
[52] U.S. Cl. .............. 156/659.1; 156/643; 156/657; 156/662; 156/345; 219/121.69; 430/296; 430/313; 430/317; 437/228; 437/249; 148/33; 257/347; 257/618
[58] Field of Search .............. 437/23, 249, 228; 357/23.7, 55; 156/633, 643, 654, 657, 656, 655, 659.1, 662, 664, 663, 665, 666, 668, 345; 148/33, 33.5; 430/296, 317, 318, 313, 314, 324, 329; 219/121.12, 121.21, 121.35, 121.69, 121.85, 121.86; 427/43.1, 53.1

[56] References Cited

U.S. PATENT DOCUMENTS

| | | | |
|---|---|---|---|
| 3,401,448 | 9/1968 | Iles et al. | 437/249 X |
| 3,534,467 | 10/1970 | Sachs et al. | 437/249 |
| 3,976,508 | 8/1976 | Mlavsky | 136/246 |
| 5,106,455 | 4/1992 | Jacobsen et al. | 156/659.1 |
| 5,131,976 | 7/1992 | Hoko | 156/630 |

Primary Examiner—William A. Powell
Attorney, Agent, or Firm—Thorpe North & Western

[57] ABSTRACT

An apparatus and method for the nonplanar treatment of a volumetric workpiece or substrate utilizing exposure beam lithography are disclosed. The method includes supplying one or more layers of one or more semiconductor materials to surfaces of the substrate, applying a resist over the semiconductor layers, setting the resist, and then directing an exposure beam, such as an electron beam, toward the substrate. The substrate is then moved in at least two degrees freedom of movement, relative to the beam, with one degree of freedom of movement being the rotating of the substrate about an axis generally perpendicular to the beam. The other degree of freedom of movement could be moving the substrate linearly in a direction generally parallel to the axis. By such movement, the resist is exposed to the beam in a predetermined pattern. The exposed resist is then developed and a layer or layers under the exposed resist are etched. The remaining resist is then removed yielding the desired semiconductor device.

22 Claims, 1 Drawing Sheet

METHOD AND APPARATUS FOR FABRICATION OF THIN FILM SEMICONDUCTOR DEVICES USING NON-PLANAR, EXPOSURE BEAM LITHOGRAPHY

This is a continuation-in-part application of application Ser. No. 07/647,659, filed Jan. 28, 1991 now U.S. Pat. No. 5,106,455, issued Apr. 21, 1992.

BACKGROUND OF THE INVENTION

This invention relates to a system for fabricating thin film semiconductor devices utilizing exposure beam lithography over non-planar surfaces of the devices.

Lithographic techniques have been utilized for some time in the manufacture especially of integrated circuit boards, semiconductor devices and related products. The products manufactured, of course, have typically included planar surface areas to which the lithographic techniques were applied. Such techniques have proven extremely effective in the precise manufacturing and formation of very small details in the product. However, attempts to apply such techniques to other than planar surfaces have proven difficult, if not unachievable, to the present time. As a result, the versatility available in semiconductor devices and constructs has been limited to use of essentially planar components.

SUMMARY OF THE INVENTION

It is an object of the invention to provide a method and apparatus for fabricating thin film semiconductor devices utilizing lithographic techniques applied over nonplanar devices.

It is also an object of the invention to provide such a method and apparatus which allows the fabrication of fine details over non-planar surface areas of a workpiece.

It is a further object of the invention to provide such a method and apparatus in which precise control of the fabrication process may be effectuated.

It is still another object of the invention to provide such a method and apparatus in which a workpiece may be moved in several degrees of freedom of movement relative to an exposure beam, in a precise and efficient manner.

The above and other objects of the invention are realized in a specific illustrative embodiment of apparatus which includes a chamber, a beam generator disposed in the chamber for producing and directing an exposure beam towards a work location, a chuck disposed in the chamber for holding and positioning a workpiece or volumetric substrate at the work location, and a first element, to which the chuck is attached, responsive to first control signals for selectively moving the chuck, and thus the substrate, in a first degree of freedom of movement, to thereby expose different areas of the substrate to the beam. Also included are a second element, to which the first element is attached, responsive to second control signals for selectively moving the first element, and thus the chuck and substrate, in a second degree of freedom of movement to thereby expose still other areas of the substrate to the beam, and a controller for developing and supplying the first control signals to the first element and the second control signals to the second element.

Advantageously, the chamber is a vacuum chamber and the exposure beam is an electron beam. With this apparatus, a substrate may be covered with one or more layers of one or more semiconductor materials such as silicon and an insulator layer. The layers would then be covered with an electron beam resist, and the resist set by applying heat thereto. The substrate may then be placed in the chuck and the beam directed toward the substrate as the substrate is moved in some predetermined manner by the first and second elements to thereby expose to the electron beam a semiconductor device pattern in the resist. After developing the exposed resist, the desired pattern could then be etched in the workpiece by applying an appropriate etchant. The pattern or portions thereof may be doped with selected charge types (N-type or P-type) to produce a desired semiconductor device. Selected conductor patterns could be applied to the substrate, utilizing the apparatus, to thus provide needed electrical connections for operating the device. In this manner, a non-planar semiconductor pattern could be formed in the volumetric or three-dimensional substrate in a precise and efficient manner.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
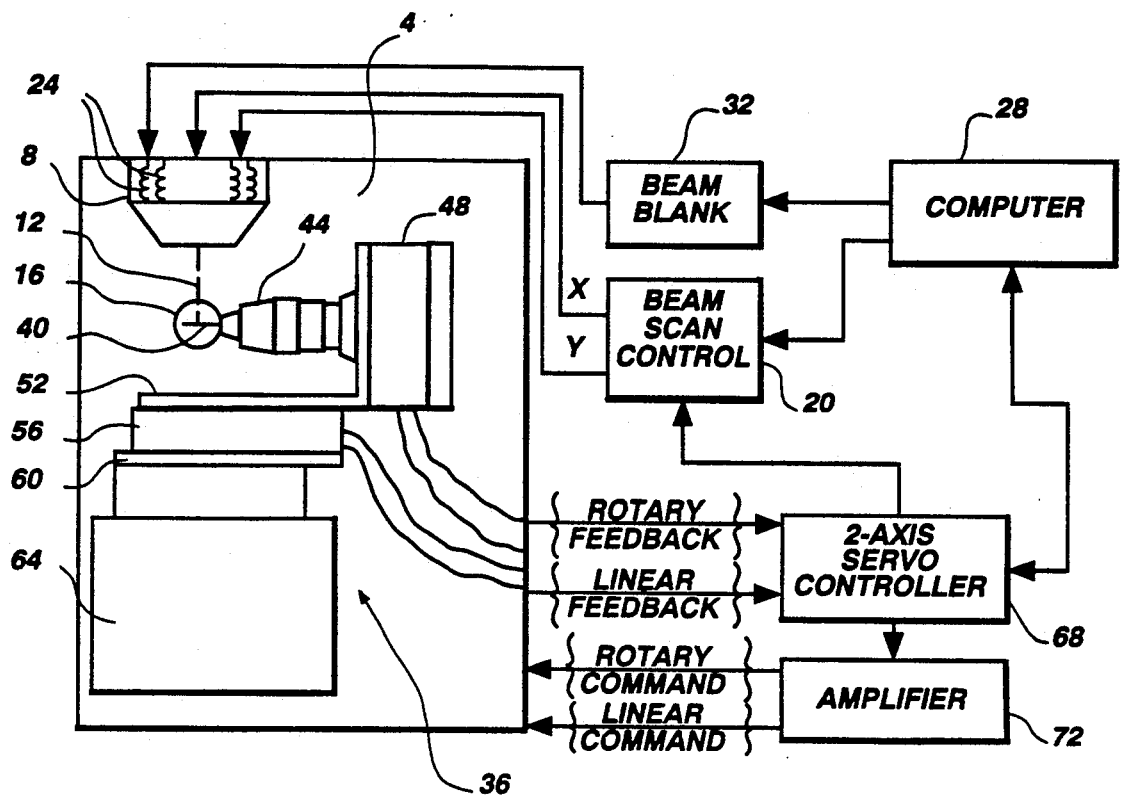
FIG. 1 is a schematic view of apparatus for the non-planar treatment of a workpiece using lithographic techniques, made in accordance with the principles of the present invention.

Referring to FIG. 1, there is shown an electron beam vacuum chamber 4 in which is disposed a conventional electron beam generator 8 of a scanning electron microscope. The electron beam generator 8 produces an electron beam 12 which is directed towards a work area 16. The direction of the electron beam 12 is under control of a beam scan control unit 20 and may be changed or caused to move along two orthogonal axes (designated the x and y axes) laterally of the beam. The beam scan control unit 20 applies analog signals to coils 24 in the electron beam generator 8 to control the direction of the electron beam 12, all in a conventional manner. The beam scan control unit 20 might illustratively be a digital-to-analog converter which receives digital signals from a computer 28 identifying the x and y coordinates which the electron beam 12 is to have. The computer 28, which controls the overall operation of the system of FIG. 1, could illustratively be a Compaq 386 computer.

A conventional beam blanking circuit 32 is provided to operate under control of the computer 28 to vary the intensity of electron beam 12. This intensity can be varied from zero (no beam) up to some predetermined upper limit intensity. Such operation is well known.

Also disposed in the vacuum chamber 4 is a workpiece or substrate positioning mechanism 36 for selectively moving and positioning a workpiece or substrate 40 which, in the embodiment shown in FIG. 1, is a cylindrical bar. The substrate 40 is held by conventional chuck 44 which, in turn, is rotatably held by a rotary motorized stage 48. The rotary stage 48 is mounted on a bracket 52 which, in turn, is mounted on a linear motorized stage 56 which is moveable linearly on a track 60. The track 60 is mounted on a base 64 which may be manually moved and positioned in the chamber 4 as desired.

Both the rotary stage 4 and the linear stage 56 operate under control of the computer 28. The rotary stage 48 selectively causes rotation of the chuck 44 which, in turn, causes the substrate 40 to rotate about an axis which is generally perpendicular to the electron beam 12, as shown. The linear stage 56, when it moves linearly on the track 60, carries with it the bracket 52, rotary stage 48, chuck 44 and thus the substrate 40, in the direction of travel of the linear stage which is a direction parallel to the axis of rotation of the substrate. In this manner, the substrate 40 may be selectively moved under the electron beam 12 both rotationally and linearly to cause the electron beam to fall or impinge on different convex surface areas of the substrate. In addition, the electron beam 12 can itself be caused to move orthogonally relative to the location of the workpiece under control of the beam scan control unit 20. The rotary motorized stage 48 might illustratively be a 360 degree continuous rotation stage, No. 345,341, manufactured by Klinger, and the linear motorized stage 56 might illustratively be a translational stage, No. MFO4 also manufactured by Klinger.

Control of the operation of the rotary stage 48 and the linear stage 56 is effectuated by a two-axis servo controller 68 and an amplifier 72, again under control of the computer 28. The computer 28 supplies signals to the controller 68 in the form of commands for movement of the rotary stage 48 and linear stage 56. These signals are supplied to the amplifier 72 which then supplies rotary command signals to the rotary stage 48 and linear command signals to the linear stage 56 to cause the desired operation of the stages. As the rotary stage 48 and linear stage 56 are operated, both develop feedback signals representing the respective degrees of movement of the stages and these signals are supplied to the controller 68 which, in turn, supplies the signals to the computer 28. The computer 28 compares the feedback signals with the previously issued command signals to determine if the movement of the stages was in accordance with the command signals, and to make appropriate corrections if needed. The two-axis servo controller 68 might illustratively be a Galil DMC-620 controller and the amplifier 72 might illustratively be a Galil ICB-960 amplifier.

Figure 2:
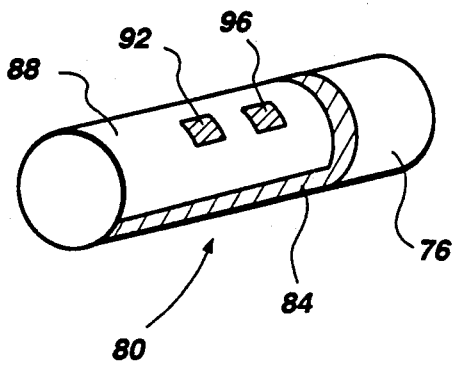
FIG. 2 is a perspective view of a cylindrical workpiece etched with a semiconductor pattern using the apparatus of FIG. 1.

FIG. 2 is a perspective view of a cylindrical bar 76 on which a semiconductor device, namely a field-effect transistor FET 80, has been deposited and etched using the apparatus of FIG. 1. The device includes a layer of semiconductor material 84 overlaid with an insulator layer 88, in which are etched a source region 92 and drain 96 region, using an electron beam lithographic process as will be described momentarily.

Figure 3:
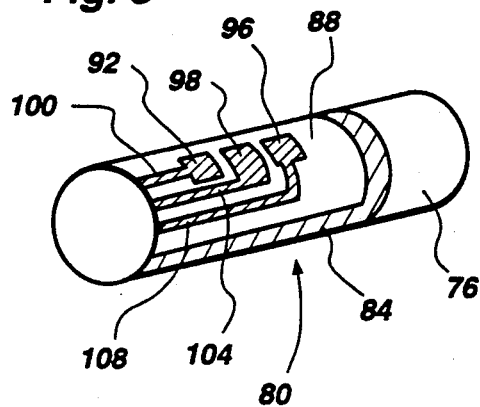
FIG. 3 is a perspective view of a cylinder workpiece formed with a conductor pattern using the apparatus of FIG. 1.

FIG. 3 shows the bar 76 formed with conductors 100, 104 and 108 for connecting to the source 92, gate 98 and drain 96 respectively of the transistor device 80.

Although two degrees of freedom of movement of the substrate 40 is possible with the apparatus of FIG. 1, clearly other degrees of freedom of movement could also be provided for the substrate. For example, an additional linear degree of freedom of movement could be provided, the direction of which would be generally perpendicular to both the electron beam 12 and the direction of movement of the linear stage 56. This could be done by mounting the track 60 on another linear stage which would be moveable in a direction which was at right angles to the direction and movement of the stage 56. Also, the bracket 52 could be mounted on another rotational stage to allow rotation of the bracket and thus the substrate 40 about an axis generally parallel to the electron beam 12 to thereby provide two rotational degrees of freedom of movement for the substrate. In all, three rotational degrees of freedom of movement could be provided, along with three linear degrees of freedom of movement (although movement toward and away from the electron beam generator 8 in a linear fashion would probably not be too useful), or any combination thereof.

Although the apparatus of FIG. 1 utilizes an electron beam 12, it should be understood that the apparatus could be provided for directing a laser beam, ion beam, or an x-ray beam, toward a substrate in the same manner as that described for the electron beam.

An illustrative lithographic process for use with the apparatus of FIG. 1 to produce the FET 80 of FIGS. 2 and 3 on the cylinder 76 will next be described. The cylinder 76, which might illustratively be quartz, silica, sapphire, or other nonconductive material, is cleaned using a solvent such as acetone and two-propanol, or using a hydrogen peroxide cycle. A layer 84 of semiconductor material such as P-type doped silicon is then applied to the cylinder 76 using conventional application techniques such as sputtering, chemical vapor deposition, dip coating or plating. The thickness of the layer might illustratively be from 2,000 to 7,000 Angstroms, and is shown as overlying only part of the cylinder 76. Next, an insulator material 88 is applied over the semiconductor layer 84, again by sputtering, chemical vapor deposition, dip coating, or plating, to a thickness of from 2,000 to 3,000 Angstroms. The insulator material might illustratively be silicon nitride, silicon dioxide, or some combination of the two. At this point, it would be desirable to coat the cylinder 76 with an adhesion promoter such as HMDS which improves the ability of electron beam resist to adhere to the surface. Thereafter an electron beam resist would be applied to the cylinder 76 to overly the insulator layer 88—this could be accomplished by simply dipping the cylinder in a solution of the resist.

The electron beam resist is then set by soft-baking the cylinder in a convection oven, for example, for about 30 minutes at about 80 degrees centigrade. The cylinder is then placed in the chuck 44 (FIG. 1) and then the electron beam generator 8 and mechanism 36 are operated to expose the cylinder to the electron beam 12 in the desired pattern. For example, the cylinder 76 could be moved linearly and rotationally to expose first the region 92 and then the region 96 shown in FIG. 2. This could be done by moving the cylinder 76 axially the width of region 92, rotating the cylinder slightly and then moving the cylinder in the opposite direction again the width of the region 92, again rotating the cylinder slightly and moving the cylinder in the opposite direction again, etc. until the entire region had been exposed to the electron beam. The same process could be followed for exposing region 96.

After exposure of the desired pattern is completed, the exposed resist is developed, during which the resist overlying the pattern, i.e., regions 92 and 96, is washed away (positive lithography). The cylinder 76 is then baked in a convection oven, again for about 30 minutes at 80 degrees centigrade, for example. The cylinder is now ready for etching which is carried out by exposing the cylinder to an appropriate etching agent. In positive lithography, the pattern or two regions 92 and 96 would be etched directly for example by using buffered hydrofluoric acid to remove insulator from the regions, down to the semiconductor layer 84. Following the etching step, the remaining electron beam resist is removed and the cylinder is ready for the next step in the fabrication process.

To produce the desired transistor, in this case a fieldeffect transistor, the regions 92 and 96 of the semiconductor material 84 are doped, for example, with phosphorous to produce N-type doped source 92 and drain 96 regions, in the already P-type doped silicon layer 84.

The next step in the process is to provide a conductor pattern, such as shown in FIG. 3, on the insulator material 88 to allow for applying electrical signals to and receiving electrical signals from the transistor 80. This is done by applying a layer of aluminum or other conductive material to the cylinder 76 such as by sputtering, chemical vapor deposition, etc. to a thickness of about 3,000 Angstroms. Electron beam resist is then applied over the layer of conductive material and set as before described. The cylinder is placed in the chuck 44 and the electron beam generator and mechanism 36 operated to expose the cylinder to the electron beam 12 to all *but* the conductor patterns 100, 104, and 108 as shown in FIG. 3 (negative lighography). After exposure is completed, the exposed electron beam resist is developed and washed away leaving resist overlying only the conductor patterns. That part of the aluminum layer from which the resist was washed away is then etched, i.e., removed, leaving the aluminum in the conductor patterns 100, 104 and 108 as shown in FIG. 3. The resist on the remaining aluminum is then removed to yield the FET transistor shown in FIG. 3, having a source region 92, drain region 96 and gate region 98, all connected respectively by conductors 100, 108 and 104 to one end of the cylinder 76. The conductor patterns shown in FIG. 3 could alternatively have been formed using deposition of conductor material onto resist-etched-away patterns on the insulator material, in a well-known manner.

Although the fabrication of a specific semiconductor device was described and shown in FIGS. 2 and 3, it is apparent that a variety of semiconductor devices or other solid state electronic devices could be formed on volumetric substrates such as the cylinder 76 in FIGS. 2 and 3, using the method of the present invention.

It is to be understood that the above-described arrangements are only illustrative of the application of the principles of the present invention. Numerous modifications and alternative arrangements may be devised by those skilled in the art without departing from the spirit and scope of the and the appended claims are intended to cover such modifications and arrangements.

What is claimed is:

1. A method of etching a semiconductor device pattern on a generally convex surface of a workpiece comprising
   (a) applying a semiconductor material to the surface of the workpiece,
   (b) applying an insulator material over the semiconductor material,
   (c) applying a resist over the insulator material,
   (d) setting the resist,
   (e) directing an exposure beam toward the workpiece,
   (f) moving the workpiece in at least two degrees of freedom of movement relative to the beam to expose said semiconductor device pattern in the resist to the beam,
   (g) developing the exposed resist on the insulator material,
   (h) etching the pattern on the insulator over which the exposed resist was located, and
   (i) removing the remaining resist from the insulator material.

2. A method as in claim 1 further including the steps of
   (j) doping selected portions of the pattern with a selected electrical charge type, and
   (k) applying conductive material to the workpiece to contact selected portions of the pattern.

3. A method as in claim 2 wherein step (k) comprises
   (l) applying the conductive material over the insulator material and the pattern,
   (m) applying a resist over the conductive material,
   (n) setting the resist,
   (o) directing an exposure beam toward the workpiece,
   (p) moving the workpiece in at least two degrees of freedom of movement relative to the beam to expose a predetermined conductor pattern in the resist to the beam,
   (q) developing the exposed resist on the conductive material,
   (r) etching the conductor pattern on the conductive material over which the exposed resist was located, and
   (s) removing the remaining resist from the conductive material.

4. A method as in claim 3 further including the step of
   (t) bonding electrical leads to selected locations on the conductive material of the conductor pattern.

5. A method as in claim 1 wherein said workpiece is made of an electrically insulative material.

6. A method as in claim 5 wherein said workpiece is material selected from the group consisting of quartz, silica, and sapphire.

7. A method as in claim 1 wherein said material applying steps (a), (b) and (l) comprise sputtering the material to coat the workpiece.

8. A method as in claim 3 wherein said applying steps (a), (b), (c), (l) and (m) comprise dipping the workpiece in solutions of the material being applied.

9. A method as in claim 1 wherein said material applying steps (a), (b) and (l) comprise vapor deposition of the material onto the workpiece.

10. A method as in claim 1 wherein step (a) comprises applying silicon to the workpiece.

11. A method as in claim 10 wherein step (b) comprises applying a material selected from the group consisting of silicon nitride and silicon dioxide.

12. A method as in claim 1 wherein the exposure beam is an electron beam.

13. A method as in claim 1 wherein the exposure beam is an ion beam.

14. A method as in claim 1 wherein the exposure beam is a laser beam.

15. A method as in claim 1 wherein the exposure is an x-ray beam.

16. A method as in claim 1 wherein said moving steps comprise the steps of rotating the workpiece about an axis generally perpendicular to the beam, and moving the workpiece linearly in a direction parallel to the axis.

17. A device made in accordance with the method of claim 1.

18. A method of constructing a thin film semiconductor device on a substrate workpiece having at least some generally convex surfaces comprising
   (a) applying one or more layers of one or more semiconductor materials to surfaces of the workpiece,
   (b) applying a resist over the layers applied in step (a),
   (c) setting the resist,
   (d) directing an exposure beam toward the workpiece,
   (e) moving the workpiece in at least two degrees of freedom of movement relative to the beam, at least one of said degrees of freedom of movement comprising rotating the workpiece about an axis generally perpendicular to the beam, to expose to the beam in the resist a predetermined semiconductor device pattern,
   (f) developing the exposed resist,
   (g) etching/depositing the pattern on the layers over which the exposed resist was located, and
   (h) removing the remaining resist from the layers.

19. A method as in claim 18 further including the step of
   (i) applying conductive material over the layers at preselected locations.

20. A method as in claim 19 wherein step (e) comprises moving the workpiece linearly in a direction generally parallel to said axis.

21. A device made in accordance with the method of claim 18.

22. A method of fabricating microcircuits on a volumetric substrate comprising
   (a) applying etchable microcircuit material to the substrate,
   (b) applying an exposure beam resist over the etchable material,
   (c) setting the resist,
   (d) moving the substrate in at least two degrees of freedom of movement while the substrate is in the pathway of an exposure beam, to thereby expose a predetermined microcircuit pattern in the resist,
   (e) developing the exposed resist,
   (f) etching/depositing the microcircuit material on the substrate to produce the desired pattern in the material, and
   (g) removing the remaining resist from the material.

* * * * *